US008640062B2

(12) United States Patent  
Agarwal et al.

(10) Patent No.: US 8,640,062 B2  
(45) Date of Patent: Jan. 28, 2014

(54) RAPID ESTIMATION OF TEMPERATURE RISE IN WIRES DUE TO JOULE HEATING

(75) Inventors: Kanak B. Agarwal, Austin, TX (US); Sani R. Nassif, Austin, TX (US); Ronald D. Rose, Essex Junction, VT (US); Chenggang Xu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 206 days.

(21) Appl. No.: 13/157,980

(22) Filed: Jun. 10, 2011

(65) Prior Publication Data

US 2012/0317529 A1 Dec. 13, 2012

(51) Int. Cl.
*G06F 17/50* (2006.01)

(52) U.S. Cl.
USPC ........... 716/103; 716/106; 716/108; 716/109; 716/132; 716/133; 716/134

(58) Field of Classification Search
USPC .......... 716/103, 106–113, 119–120, 132–134
See application file for complete search history.

(56) References Cited

U.S. PATENT DOCUMENTS

| 6,038,383 | A | 3/2000 | Young et al. | |
|---|---|---|---|---|
| 6,513,000 | B1 | 1/2003 | Toda | |
| 6,634,013 | B2 | 10/2003 | Shinzawa | |
| 7,331,023 | B2 | 2/2008 | Sercu et al. | |
| 7,716,620 | B2 | 5/2010 | Agarwal et al. | |
| 2004/0049750 | A1* | 3/2004 | Gentry et al. | 716/5 |
| 2009/0013290 | A1* | 1/2009 | Keinert et al. | 716/4 |
| 2009/0164183 | A1 | 6/2009 | Smith et al. | |
| 2009/0187869 | A1* | 7/2009 | Jain et al. | 716/6 |
| 2010/0057412 | A1 | 3/2010 | Tanomura et al. | |
| 2010/0138207 | A1 | 6/2010 | Moore | |
| 2012/0096424 | A1* | 4/2012 | Burd et al. | 716/136 |

FOREIGN PATENT DOCUMENTS

| JP | 11175576 A | 7/1999 |
|---|---|---|
| WO | WO2008075611 A1 | 6/2008 |

OTHER PUBLICATIONS

Ajami, Amir H. et al., "Modeling and Analysis of Nonuniform Substrate Temperature Effects on Global ULSI Interconnects", IEEE Transactions on Computer-Aided Design of Integrated Circuits and Systems, vol. 24, No. 6, Jun. 2005, pp. 849-861.

Chen, Danqing et al., "Interconnect Thermal Modeling for Accurate Simulation of Circuit Timing and Reliability", IEEE Transactions on Computer-Aided Design of Integrated Circuits and Systems, vol. 19, No. 2, Feb. 2000, pp. 197-205.

(Continued)

*Primary Examiner* — Paul Dinh
(74) *Attorney, Agent, or Firm* — Stephen R. Tkacs; Stephen J. Walder, Jr.; Libby Z. Toub

(57) ABSTRACT

A mechanism is provided for rapid estimation of temperature rise in wires due to Joule heating. The mechanism provides fast and accurate estimation of temperature rise in wires due to self heating. Fast estimation is important to handle millions of nets at the full-chip level. The mechanism models lateral heat flow by considering longitudinal heat flow along the wire and lateral thermal coupling to the other wires in the same level. Lateral heat flow can have a significant effect on the temperature rise. The mechanism also models vertical heat flow to the substrate and the heat sink by considering thermal conductivities of vias and inter-layer dielectric (ILD). The mechanism efficiently solves the thermal system to enable physical design optimizations (e.g., wire sizing, etc.) for fixing electromigration violations.

19 Claims, 5 Drawing Sheets

(56) References Cited

OTHER PUBLICATIONS

Chiang, Ting-Yen et al., "Compact Modeling and SPICE-Based Simulation for Electrothermal Analysis of Multilevel ULSI Interconnects", Proceedings of the 2001 IEEE/ACM International Conference on Computer-Aided Design (ICCAD'01), 2001, pp. 165-172.

Huang, Wei et al., "Compact Thermal Modeling for Temperature-Aware Design", Proceedings of the 41st Design Automation Conference, San Diego, California, Jun. 2004, pp. 878-883.

Labun, Andrew et al., "Rapid Detailed Temperature Estimation for Highly Coupled IC Interconnect", IEEE Transactions on Computer-Aided Design of Integrated Circuits and Systems, vol. 27, No. 10, Oct. 2008, pp. 1840-1851.

Sundaresan, Krishnan et al., "Accurate Energy Dissipation and Thermal Modeling for Nanometer-Scale Buses", Proceedings of the 11th International Symposium on High-Performance Computer Architecture (HPCA-11 2005), 2005, 10 pages.

* cited by examiner

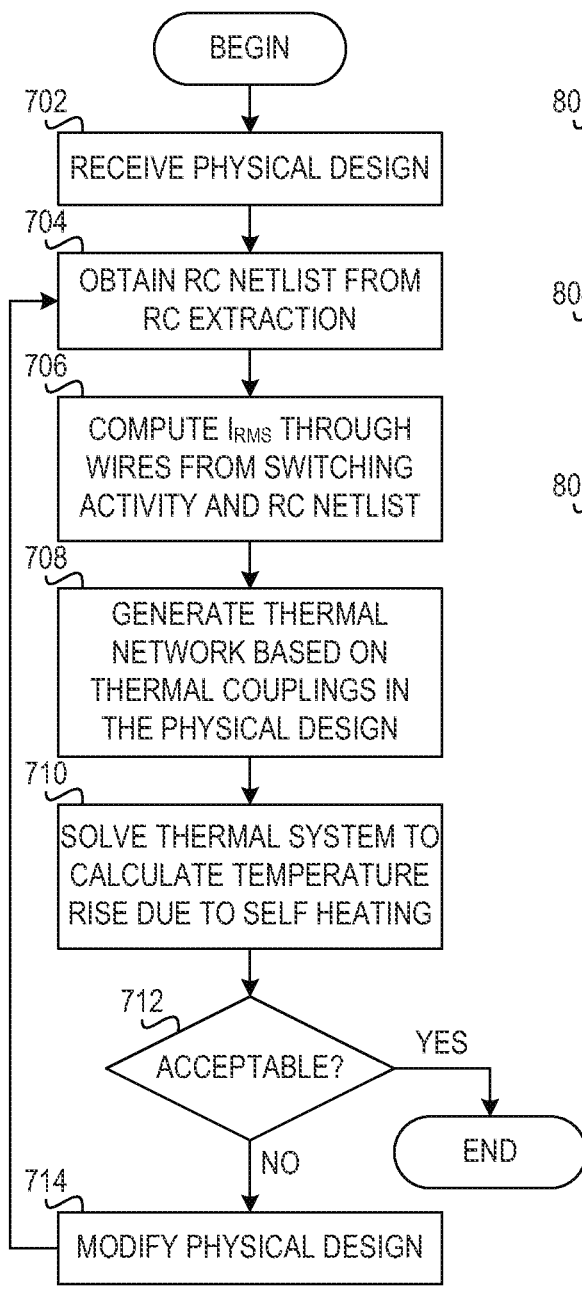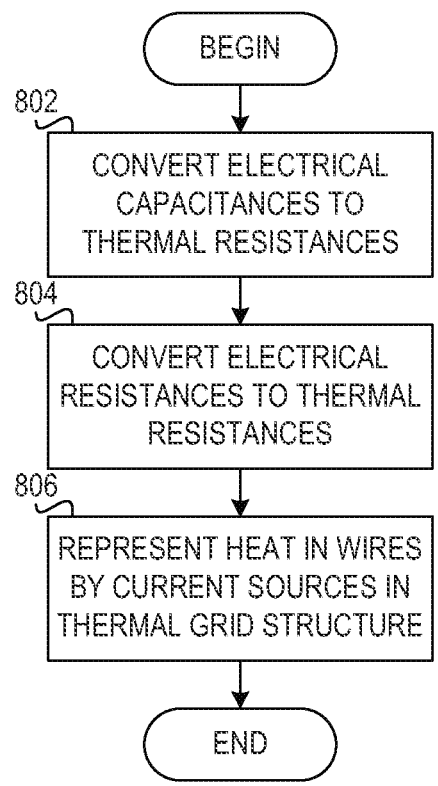

RAPID ESTIMATION OF TEMPERATURE RISE IN WIRES DUE TO JOULE HEATING

BACKGROUND

The present application relates generally to an improved data processing apparatus and method and more specifically to mechanisms for rapidly estimation of temperature rise in wires due to Joule heating.

Joule heating is the process by which the passage of an electric current through a conductor releases heat. Joule heating is referred to as ohmic heating or resistive heating because of its relationship to Ohm's Law. It forms the basis for the myriad of practical applications involving electric heating. In applications where heating is an unwanted by-product of current use (e.g., load losses in electrical transformers) the diversion of energy is often referred to as resistive losses.

A typical integrated circuit package comprises a package having connections to input/output pins, interconnect layers, a substrate, and a heat sink. Within a package, wires in the interconnect layer experience poor heat transfer due to low thermal conductivity of inter-layer dielectric and not being close enough for the heat sink to remove heat. Self heating depends on root mean square (IMS) current density. Self heating of wires lowers meant time to failure (MTF) and worsens wire delay (higher resistance). Self heating of wires may also cause thermomigration due to thermal gradients.

Electromigration is the transport of material caused by the gradual movement of the ions in a conductor due to the momentum transfer between conducting electrons and diffusing metal atoms. The effect is important in applications where high direct current densities are used, such as in microelectronics and related structures. As the structure size in electronics such as integrated circuits (ICs) decreases, the practical significance of this effect increases. Electromigration and Joule heating concerns worsen with technology scaling. Currents flowing through the wires do not scale proportional to wire dimensions. Low-k dielectrics and higher resistivity due to surface scattering aggravate the problem.

Prior art methods for estimating temperature rise due to Joule heating are based on the well-known duality between thermal and electrical phenomena. The prior art methods usually consider only simple physical geometries and heat flow paths. These methods are not applicable to cases with arbitrary wire geometries and thermal couplings between nets. In addition, these prior art methods are not very accurate due to various simplifying assumptions.

Other prior art methods are based on numerical thermal analysis, such as the finite element methods for solving partial differential equations (PDEs). These methods usually are not extendable for full-chip self heating analysis in millions of nets.

SUMMARY

In one illustrative embodiment, a method, in a data processing system, is provided for estimating temperature rise in wires due to self heating. The method comprises receiving, in the data processing system, a physical design for an integrated circuit, the physical design comprising one or more interconnect layers having a plurality of wires separated by a dielectric. The method further comprises computing, by the data processing system, a root mean square current through the plurality of wires based on switching activity and a resistance and capacitor netlist representing the one or more interconnect layers. The method further comprises generating, by the data processing system, a thermal network based on thermal couplings of the plurality of wires in the one or more interconnect layers. The method further comprises determining, by the data processing system, a temperature rise in the plurality of wires based on the thermal network and the computed root mean square current.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 7 is a flowchart illustrating operation of a mechanism for full-chip thermal analysis in accordance with an illustrative embodiment;

FIG. 8 is a flowchart illustrating operation of a mechanism for generating a thermal network based on thermal couplings in a physical design in accordance with an illustrative embodiment.

DETAILED DESCRIPTION

The illustrative embodiments provide a mechanism for rapid estimation of temperature rise in wires due to Joule heating. The mechanism provides fast and accurate estimation of temperature rise in wires due to self heating. Fast estimation is important to handle millions of nets at the full-chip level. The mechanism models lateral heat flow by considering longitudinal heat flow along the wire and lateral thermal coupling to the other wires in the same level. Lateral heat flow can have a significant effect on the temperature rise. The mechanism models vertical heat flow to the substrate and the heat sink by considering thermal conductivities of vias and inter-layer dielectric (ILD). The mechanism efficiently solves the thermal system to enable physical design optimizations (e.g., wire sizing, etc.) for fixing electromigration violations.

Figure 1:
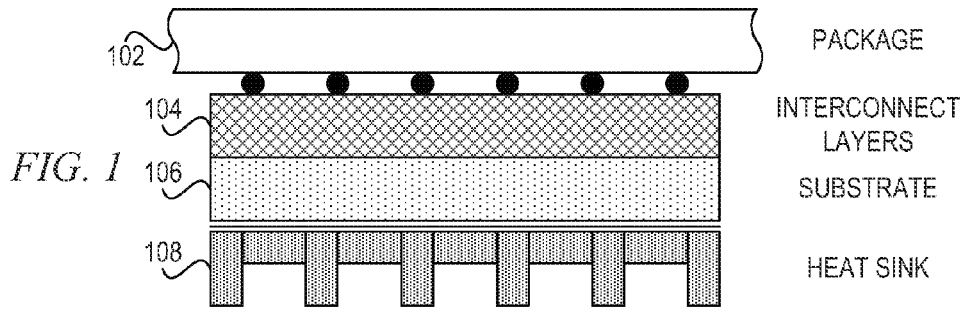
FIG. 1 depicts an example chip package in which an integrated circuit may experience self-heating of wires due to resistive power dissipation.

FIG. 1 depicts an example chip package in which an integrated circuit may experience self-heating of wires due to resistive power dissipation. Package 102 provides connectivity to input/output pins for an integrated circuit. Interconnect layers 104 connect to package 102 by balls of solder. Interconnect layers 104 provide metal wires for connecting various components in substrate 106. Interconnect layers 104 may connect to elements in substrate 106 through vias that provide connection through one or more layers. Heat sink 108 is attached to substrate 106 using an adhesive. Heat sink 108 draws heat from substrate 106 and dissipates the heat into the environment.

Wires in interconnect layers 104 experience self heating, also referred to as Joule heating. The wires experience self heating because of poor heat transfer due to low thermal conductivity of inter-layer dielectric within interconnect layers 104. The self heating depends on the root mean square (RMS) current density. Self heating worsens wire delay (higher resistivity). Self heating can also lower mean time to failure (MTF) due to electromigration (EM). The MTF due to EM may be represented as follows:

$$MTF = A \times J_{avg}^{-n} \times e^{\frac{E_a}{kT}},$$

where $J_{avg}$ is the average current density and T is the absolute temperature of the wire.

Figure 2:
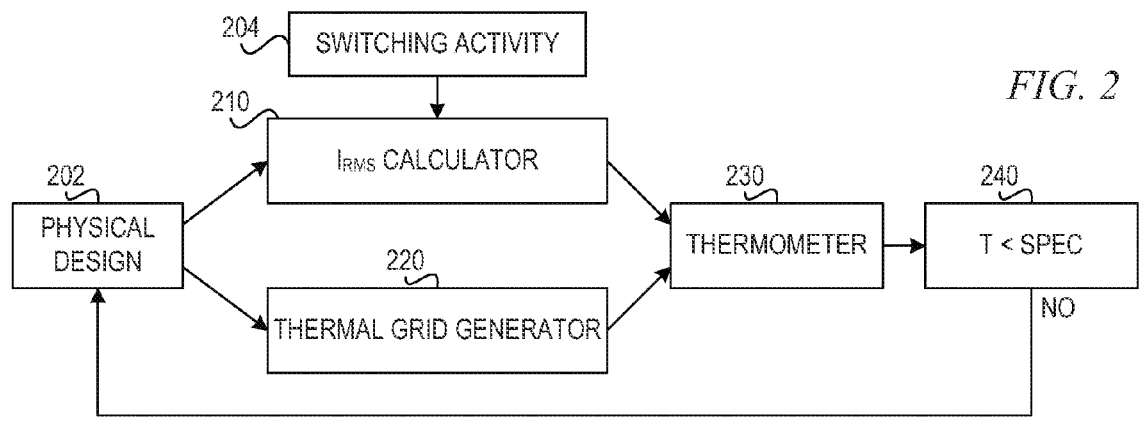
FIG. 2 is a block diagram illustrating a full-chip thermal analysis tool in accordance with an illustrative embodiment.

FIG. 2 is a block diagram illustrating a full-chip thermal analysis tool in accordance with an illustrative embodiment. The thermal analysis tool estimates temperature rise in a physical design 202. $I_{RMS}$ calculator 210 receives physical design 202 and computes the root mean squire (RMS) current through wires from switching activity 204 and a resistor/capacitor (RC) netlist from physical design 202. Thermal grid generator 220 receives physical design 202 and generates a thermal network based on the various thermal couplings in the physical design, as discussed in further detail below. Thermometer 230 receives the $I_{RMS}$ from $I_{RMS}$ calculator 210 and the thermal grid from thermal grid generator 220 and solves the thermal system to calculate temperature rise due to self heating.

Comparison component 240 compares the temperature from thermometer 230, or temperature rise, to a specified threshold (SPEC). If the temperature exceeds SPEC, then the physical design 202 is likely to experience reliability issues such as short mean time to failure (MTF) due to electromigration (EM). The designers must then modify the physical design 202, using manual or automated techniques, and repeat the process. If comparison component 240 determines that the temperature is less than SPEC, then physical design 202 is acceptable.

The full-chip self heating analysis tool assumes temperature estimation for the steady state case, $I_{RMS}$ calculator 210 calculates $I_{RMS}$ through efficient RC network analysis or momentum based closed-form models. U.S. Pat. No. 7,716,620, entitled "Moment Based Method and System for Evaluation of Metal Layer Transient Currents in an Integrated Circuit," issued May 11, 2010, describes a technique for calculating $I_{RMS}$.

Thermal grid generator 220 generates a resistive network based on thermal conductivities of wires and dielectric in lateral and vertical directions. Thermal grid generator 220 generates the thermal resistance network based on an analogy between electrical RC network and thermal resistance network. The analogy can be used because underlying partial differential equations that describe capacitance, resistance, and thermal flow are all the same, all variants of Poisson's equation.

Figure 3A:
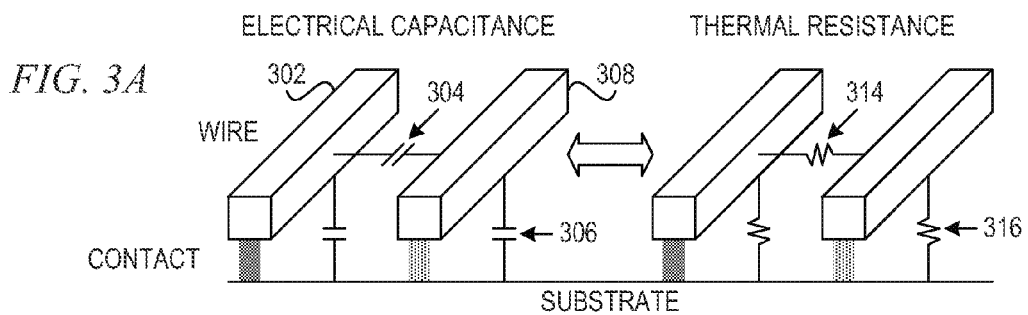
FIGS. 3A and 3B illustrate mapping electrical RC netlists to thermal resistance networks in accordance with an illustrative embodiment.
Figure 3B:
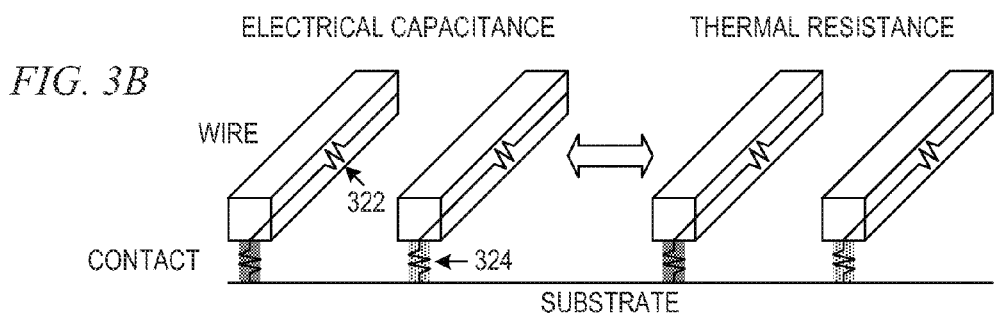

FIGS. 3A and 3B illustrate mapping electrical RC netlists to thermal resistance networks in accordance with an illustrative embodiment. Based on shapes, dimensions, and spacing of wires within the dielectric in the interconnect layers, the interconnect layers maybe represented as an RC netlist. A key benefit comes from reusing electrical RC extraction results to build the heat flow model. Much of the work of RC extraction is already being done for timing analysis.

FIG. 3A illustrates mapping electrical capacitance to inter-conductor thermal resistance in accordance with an example embodiment. Two wires separated by dielectric, and a wire and substrate separated by dielectric, form a capacitor. For example, wire 302 and wire 308 form capacitor 304, and wire 308 and the substrate form capacitor 306, each capacitor having an electrical capacitance ($C_E$). Note that each capacitance value will be different and will be mapped to different thermal resistance. The thermal grid generator maps electrical capacitance to thermal resistance. For instance, capacitor 304 is mapped to resistor 314, and capacitor 306 is mapped to resistor 316, each resistor having a thermal resistance ($R_T$). The thermal resistance ($R_T$) from electrical capacitance may be determined as follows:

$$R_T = \frac{\varepsilon}{k} \times \left(\frac{1}{C_E}\right),$$

where is the dielectric permittivity, k is the thermal conductivity of the inter-layer dielectric (ILD), and $C_E$ is the electrical capacitance. As stated above, the electrical capacitance may already be extracted for timing analysis.

FIG. 3B illustrates mapping electrical resistance to intra-conductor thermal resistance in accordance with an example embodiment. Each wire itself, vias between different wiring levels, and contact between a wire and the substrate has an electrical resistance. For example, wire 322 and contact 324 have electrical resistance ($R_E$). Once again, note that each resistance value will be different and will be mapped to different thermal resistance. The thermal resistance ($R_T$) from electrical resistance may be determined as follows:

$$R_T = \frac{R_E}{\rho \times k},$$

where ρ is the metal resistivity, k is the thermal conductivity of the wire, and $R_E$ is the electrical resistance of the wire or contact. As stated above, the electrical resistance of the wire or contact may already be extracted for timing analysis.

Figure 4A:
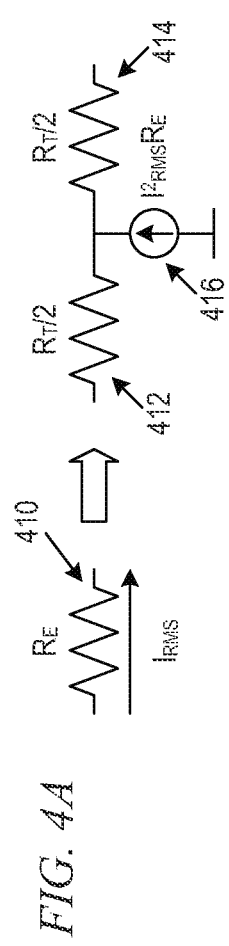
FIGS. 4A and 4B illustrate mapping RC netlist to a thermal grid in accordance with an illustrative embodiment.
Figure 4B:
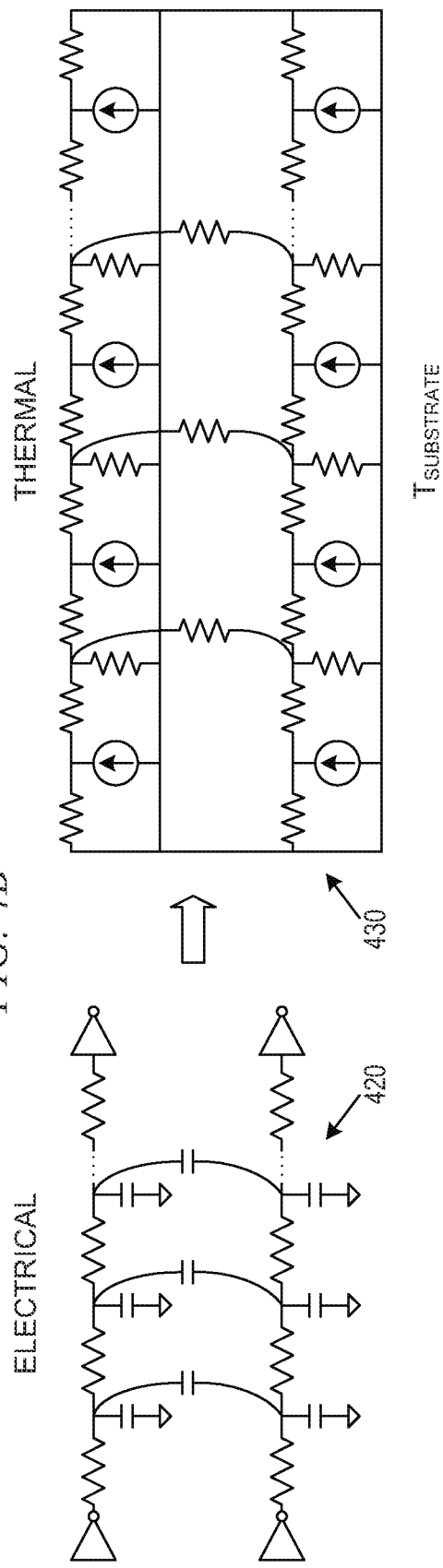

FIGS. 4A and 4B illustrate mapping RC netlist to a thermal grid in accordance with an illustrative embodiment. Based on the analogy between electrical RC and thermal resistances, an extracted RC netlist can be efficiently mapped to a thermal grid that contains all thermal resistances for lateral and vertical heat flow. FIG. 4A illustrates a representation of heat generated in wires in accordance with one example embodiment. The heat generated in wires ($I_{RMS}^2 R$) can be represented by current sources on the thermal grid structure. Thus, the heat generated by a resistor 410 with electrical resistance $R_E$ can be represented by two resistors in series 412, 414, which together have a thermal resistance $R_T$, and a current source 416.

FIG. 4B illustrates an electrical RC based thermal network in accordance with an example embodiment. The thermal grid generator converts electrical RC netlist 420 into thermal network 430 that contains resistive elements relative to substrate (ground for electrical network).

The thermal system is similar to other commonly encountered systems, such as a power grid in integrated circuits. The thermal system is a large scale resistive network with distributed current sources. The thermometer component may then solve the thermal grid with current sources to estimate temperature rise at all nodes in the grid. The thermometer component may use fast linear solvers to solve the system. The estimated temperature rise is relative to the substrate temperature. For absolute temperature, the thermometer component may couple the thermal grid with the substrate to heat sink resistive network. Alternatively, the thermometer component may use superposition to combine substrate temperature analysis with the wire self heating analysis.

Figure 5:
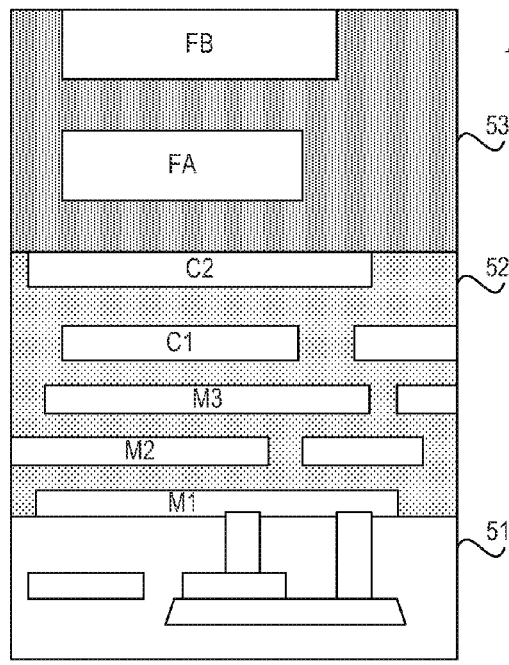
FIG. 5 depicts an example cross section of interconnect layers as test case in accordance with an illustrative embodiment.

FIG. 5 depicts an example cross section of interconnect layers as test case in accordance with an illustrative embodiment. Portion 510 depicts the substrate with various components, such as transistors and other devices. Portion 520 depicts metal layers in a first dielectric and portion 530 depicts metal layers in a second dielectric. As shown in FIG. 5, as the metal layers get farther away from the substrate, the metal layers get thicker to achieve less resistance. Thus, metal layers C1, C2 are thicker than metal layers M1, M2, M3, and metal layers FA, FB are thicker than metal layers C1, C2.

For an example test case, consider layer C1 with nine wires with 50 μm length, 0.1 μm width and 0.1 μm spacing. This example considers a nine wire case to compare lateral thermal coupling effect to other wires. This test case computes temperature rise in all wires for a 2 mA $I_{RMS}$ current. The test case considers cases with only middle wire switching and all nine wires switching and compares results for the temperature rise computed with the RC extraction based analysis of the illustrative computed with a finite element method.

Figure 6A:
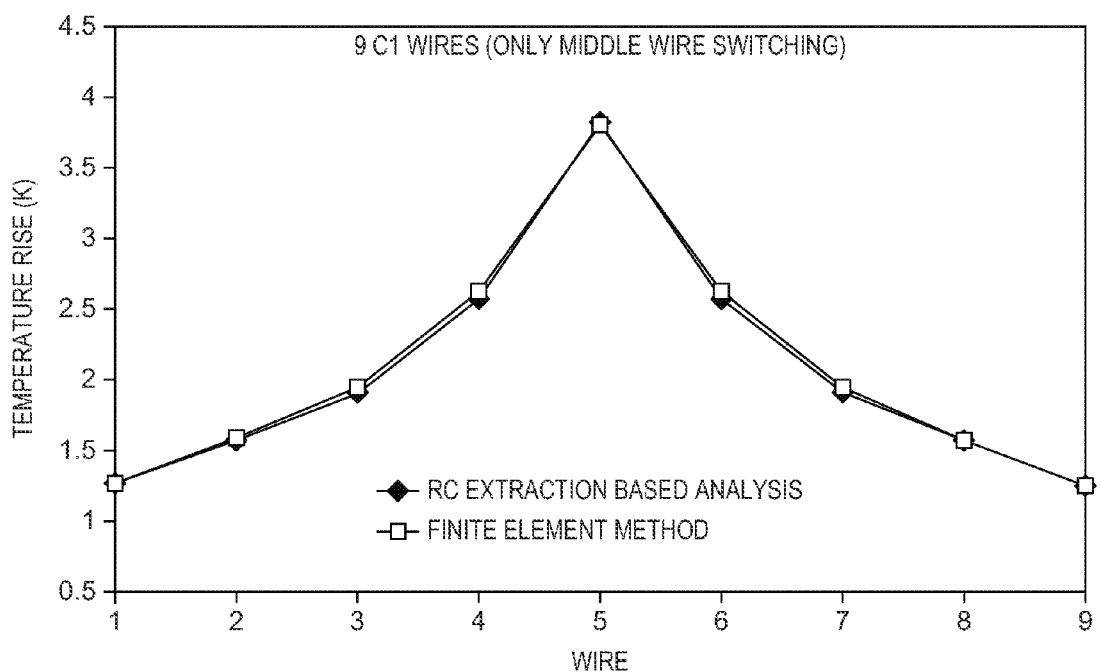
FIG. 6A is a graph showing temperature rise for nine wires with only the middle wire switching in accordance with an example embodiment.
Figure 6B:
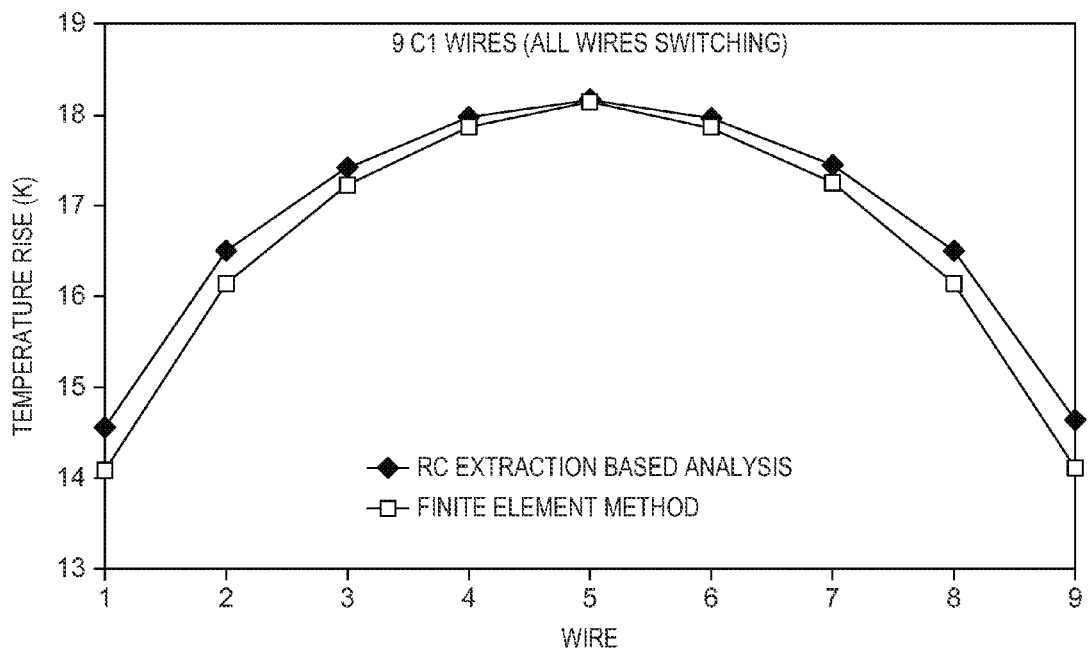
FIG. 6B is a graph showing temperature rise for nine wires with all wires switching in accordance with an example embodiment.

FIG. 6A is a graph showing temperature rise for nine wires with only the middle wire switching in accordance with an example embodiment. FIG. 6B is a graph showing temperature rise for nine wires with all wires switching in accordance with an example embodiment. As seen in FIGS. 6A and 6B, the RC extraction based analysis of the illustrative embodiments follows very closely to the finite element method of the prior art. In contract, however, the RC extraction analysis technique of the illustrative embodiments is very fast and extendable for full-chip self heating analysis in millions of nets.

The mechanisms of the illustrative embodiments provide fast identification of possible problem wires, complete with impact of surroundings. The mechanisms of the illustrative embodiments leverage existing RC extraction results obtained for timing analysis, and linear solvers for efficient temperature analysis. The mechanisms of the illustrative embodiments can be used with existing physical design optimization (e.g., wire widening, buffer insertion, etc.) tools to automatically fix violations.

As will be appreciated by one skilled in the art, the present invention may be embodied as a system, method, or computer program product. Accordingly, aspects of the present invention may take the form of an entirety hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the tatter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

FIG. 7 is a flowchart illustrating operation of a mechanism for full-chip thermal analysis in accordance with an illustrative embodiment. Operation begins, and the mechanism receives a physical design (block 702). The mechanism obtains an RC netlist from RC extraction (block 704). In one example embodiment, the mechanism may re-use RC extraction results. In a typical IC design flow, one may extract electrical resistance and capacitance from the physical layout. RC extraction is required for estimating impact of wires on circuit timing. The mechanism of the illustrative embodiments described herein can re-use these RC extraction results, thus making the approach very efficient.

The mechanism computes $I_{RMS}$ through wires from switching activity and RC netlist (block 706). The mechanism generates a thermal network based on thermal couplings in the physical design (block 708). The mechanism then solves the thermal system to calculate temperature rise due to self heating (block 710).

The mechanism determines whether the temperature rise is acceptable (block 71). If the temperature rise is not acceptable, the designer modifies the physical design using manual techniques or automated toots and optimizations (block 714). Then, operation returns to block 704 to repeat the process until the temperature rise is acceptable. If the temperature rise is acceptable in block 712, then operation ends.

FIG. 8 is a flowchart illustrating operation of a mechanism for generating a thermal network based on thermal couplings in a physical design in accordance with an illustrative embodiment. Operation begins and the mechanism converts electrical capacitances to thermal resistances (block 802). The mechanism converts electrical resistances to thermal resistances (block 804). Then, the mechanism represents heat in wires by current sources in a thermal grid structure (block 806). Thereafter, operation ends.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 9:
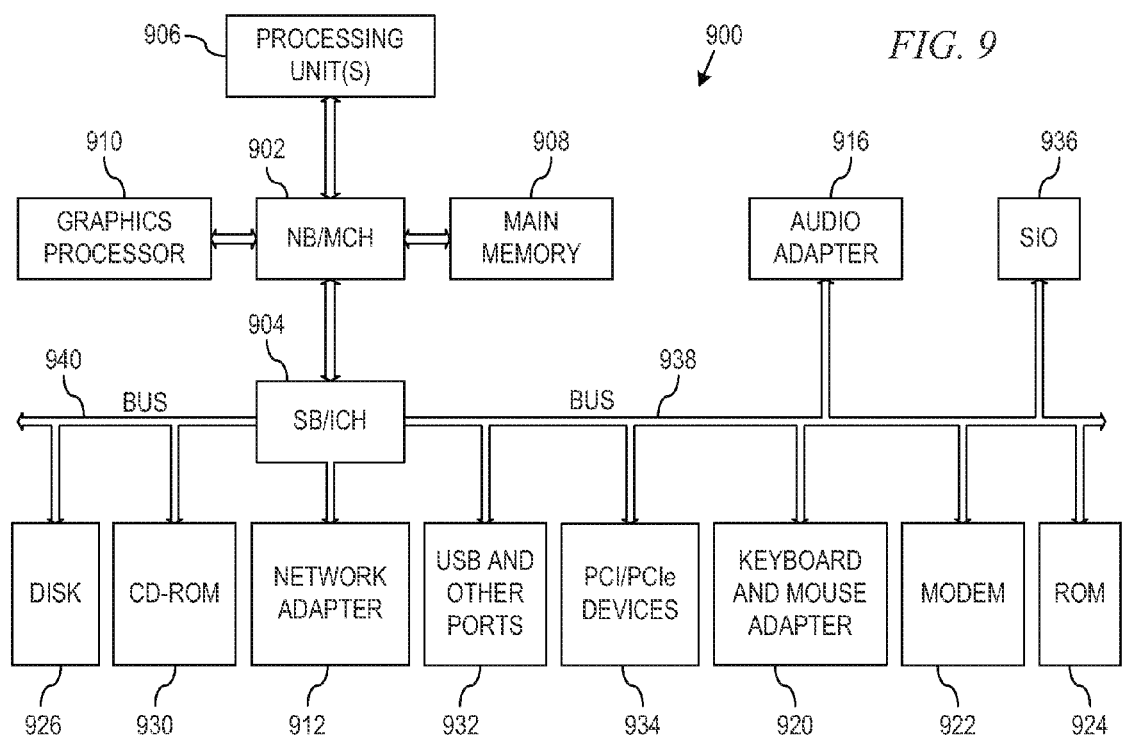
FIG. 9 is a block diagram of an example data processing system in which aspects of the illustrative embodiments may be implemented.

The illustrative embodiments may be utilized in many different types of data processing environments including a distributed data processing environment, a single data processing device, or the like. In order to provide a context for the description of the specific elements and functionality of the illustrative embodiments, FIG. 9 is provided hereafter as an example environment in which aspects of the illustrative embodiments may be implemented. It should be appreciated that FIG. 9 is only an example and is not intended to assert or imply any limitation with regard to the environments in which aspects or embodiments of the present invention may be implemented. Many modifications to the depicted environments may be made without departing from the spirit and scope of the present invention.

FIG. 9 is a block diagram of an example data processing system in which aspects of the illustrative embodiments may be implemented. Data processing system 900 is an example of a computer in which computer usable code or instructions implementing the processes for illustrative embodiments of the present invention my be located.

In the depicted example, data processing system 900 employs a hub architecture including north bridge and memory controller hub (NB/MCH) 902 and south bridge and input/output (I/O) controller hub (SB/ICH) 904. Processing unit 906, main memory 908, and graphics processor 910 are connected to NB/MCH 902. Graphics processor 910 may be connected to NB/MCH 902 through an accelerated graphics port (AGP).

In the depicted example, local area network (LAN) adapter 912 connects to SB/ICH 904. Audio adapter 916, keyboard and mouse adapter 920, modem 922, read only memory (ROM) 924, hard disk drive (HDD) 926, CD-ROM drive 930, universal serial bus (USB) ports and other communication ports 932, and PCI/PCIe devices 934 connect to SB/ICH 904 through bus 938 and bus 940. PCI/PCIe devices may include, for example, Ethernet adapters, add-in cards, and PC cards for notebook computers. PCI uses a card bus controller, while PCIe does not. ROM 924 may be, for example, a flash basic input/output system (BIOS).

HDD 926 and CD-ROM drive 930 connect to SB/ICH 904 through bus 940. HDD 926 and CD-ROM drive 930 may use, for example, an integrated drive electronics (IDE) or serial advanced technology attachment (SATA) interface. Super I/O (SIO) device 936 may be connected to SB/ICH 204.

An operating system runs on processing unit 906. The operating system coordinates and provides control of various components within the data processing system 900 in FIG. 9.

As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 900 (Java is a trademark of Oracle and/or its affiliates.).

As a server, data processing system 900 may be, for example, an IBM® eServer™ System p® computer system, running the Advanced Interactive Executive (AIX®) operating system or the LIMA operating system (IBM, eServer, System p, and AIX are trademarks of International Business Machines Corporation in the United States, other countries, or both, and LINUX is a registered trademark of Linus Torvalds in the United States, other countries, or both). Data processing system 900 may be a symmetric multiprocessor (SMP) system including a plurality of processors in processing unit 906. Alternatively, a single processor system may be employed.

Instructions for the operating system, the object-oriented programming system, and applications or programs are located on storage devices, such as HDD 926, and may be loaded into main memory 908 for execution by processing unit 906. The processes for illustrative embodiments of the present invention may be performed by processing unit 906 using computer usable program code, which may be located in a memory such as, for example, main memory 908, ROM g24, or in one or more peripheral devices 926 and 930, for example.

A bus system, such as bus 938 or bus 940 as shown in FIG. 9, may be comprised of one or more buses. Of course, the bus system may be implemented using any type of communication fabric or architecture that provides for a transfer of data between different components or devices attached to the fabric or architecture. A communication unit, such as modem 922 or network adapter 912 of FIG. 9, may include one or more devices used to transmit and receive data. A memory may be, for example, main memory 908, ROM 924, or a cache such as found in NB/MCH 902 in FIG. 9.

Those of ordinary skill in the art will appreciate that the hardware in FIG. 9 may vary depending on the implementation. Other internal hardware or peripheral devices, such as flash memory, equivalent non-volatile memory, or optical disk drives and the like, may be used in addition to or in place of the hardware depicted in FIG. 9. Also, the processes of the illustrative embodiments may be applied to a multiprocessor data processing system, other than the SMP system mentioned previously, without departing from the spirit and scope of the present invention.

Moreover, the data processing system 900 may take the form of any of a number of different data processing systems including client computing devices, server computing devices, a tablet computer, laptop computer, telephone or other communication device, a personal digital assistant (PDA), or the like. In some illustrative examples, data processing system 900 may be a portable computing device which is configured with flash memory to provide non-volatile memory for storing operating system files and/or user-generated data, for example. Essentially, data processing system 900 may be any known or later developed data processing system without architectural limitation.

Thus, the illustrative embodiments provide mechanisms for rapid estimation of temperature rise in wires due to Joule heating. The mechanisms of the illustrative embodiments provide fast identification of possible problem wires, complete with impact of surroundings. Fast estimation is important to handle millions of nets at the full-chip level. The mechanisms leverage existing RC extraction and linear solvers for efficient temperature analysis to model heat flow by considering longitudinal heat flow along the wire and lateral thermal coupling to the other wires in the same level. Lateral heat flow can have a significant effect on the temperature rise. The mechanisms model vertical heat flow to the substrate and the heat sink by considering thermal conductivities of vias and inter-layer dielectric (ILD). The mechanism efficiently solves the thermal system to enable physical design optimizations (e.g., wire sizing, etc.) for fixing electromigration violations using existing physical design optimization (e.g., wire widening, buffer insertion, etc.) tools.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for estimating temperature rise in wires due to self heating, the method comprising:

receiving, in the data processing system, a physical design for an integrated circuit, the physical design comprising one or more interconnect layers having a plurality of wires separated by a dielectric;

computing, by the data processing system, a root mean square current through the plurality of wires based on switching activity and a resistor and capacitor netlist representing the one or more interconnect layers;

generating, by the data processing system, a thermal network based on thermal couplings of the plurality of wires in the one or more interconnect layers based on the resistor and capacitor netlist; and determining, by the data processing system, a temperature rise in the plurality of wires based on the thermal network and the computed root mean square current, wherein generating the thermal network comprises:

mapping a given resistor in the resistor and capacitor netlist, representing a wire or contact in the physical design, to a thermal resistor; and determining a thermal resistance, $R_T$, of the thermal resistor as follows:

$$R_T = \frac{R_E}{\rho \times k},$$

where $\rho$ is a metal resistivity, k is a thermal conductivity of the wire or contact, and $R_E$ an electrical resistance of the wire or contact.

2. The method of claim 1, wherein generating the thermal network comprises:
converting electrical capacitances to thermal resistances.

3. The method of claim 1, wherein generating the thermal network comprises:
converting electrical resistances to a thermal resistances.

4. The method of claim 1, wherein generating the thermal network comprises:
representing heat in wires by current sources in the thermal network.

5. The method of claim 1, further comprising:
comparing the temperature rise in the plurality of wires to a threshold; and
responsive to the temperature rise being greater than the threshold, modifying the physical design.

6. The method of claim 1, further comprising:
performing resistance/capacitance extraction to obtain the resistor and capacitor netlist.

7. The method of claim 1, further comprising:
obtaining the resistor and capacitor netlist from resistance/capacitance extraction performed for circuit timing analysis.

8. The method of claim 1, wherein the thermal network is a resistive network, each resistor in the resistive network having a thermal resistance.

9. The method of claim 1, wherein generating the thermal network comprises:
mapping a given capacitor in the resistor and capacitor netlist, representing two wires separated by dielectric and a wire and a substrate separated by dielectric in the physical design, to a thermal resistor; and
determining a thermal resistance, $R_T$, of the thermal resistor as follows:

$$R_T = \frac{\varepsilon}{k} \times \left(\frac{1}{C_E}\right),$$

where $\varepsilon$ a dielectric permittivity, k is a thermal conductivity of an inter-layer dielectric (ILD) in the physical design, and $C_E$ is an electrical capacitance of the given capacitor.

10. A computer program product comprising a non-transitory computer readable storage medium having a computer readable program stored therein, wherein the computer readable program, when executed on a computing device, causes the computing device to:

receive, in the data processing system, a physical design for an integrated circuit, the physical design comprising one or more interconnect layers having a plurality of wires separated by a dielectric;

compute, by the data processing system, a root mean square current through the plurality of wires based on switching activity and a resistor and capacitor netlist representing the one or more interconnect layers;

generate, by the data processing system, a thermal network based on thermal couplings of the plurality of wires in the one or more interconnect layers based on the resistor and capacitor netlist; and determine, by the data processing system, a temperature rise in the plurality of wires based on the thermal network and the computed root mean square current, wherein generating the thermal network comprises:

mapping a given resistor in the resistor and capacitor netlist, representing a wire or contact in the physical design, to a thermal resistor; and determining a thermal resistance, $R_T$, of the thermal resistor as follows:

$$R_T = \frac{R_E}{\rho \times k},$$

where $\rho$ is a metal resistivity, k is a thermal conductivity of the wire or contact, and $R_E$ is an electrical resistance of the wire or contact.

11. The computer program product of claim 10, wherein generating the thermal network comprises:
converting electrical capacitances to thermal resistances; and
converting electrical resistances to thermal resistances.

12. The computer program product of claim 10, wherein generating the thermal network comprises:
representing heat in wires by current sources in the thermal network.

13. The computer program product of claim 10, wherein the computer readable program further causes the computing device to:
compare the temperature rise in the plurality of wires to a threshold; and
responsive to the temperature rise being greater than the threshold, modify the physical design.

14. The computer program product of claim 10, wherein the computer readable program further causes the computing device to:
obtain the resistor and capacitor netlist from resistance/capacitance extraction performed for circuit timing analysis.

15. An apparatus, comprising:
a processor; and
a memory coupled to the processor, wherein the memory comprises instructions which, when executed by the processor, cause the processor to:

receive, in the data processing system, a physical design for an integrated circuit, the physical design comprising one or more interconnect layers having a plurality of wires separated by a dielectric;

compute, by the data processing system, a root mean square current through the plurality of wires based on switching activity and a resistor and capacitor netlist representing the one or more interconnect layers;

generate, by the data processing system, a thermal network based on thermal couplings of the plurality of wires in the one or more interconnect layers based on the resistor and capacitor netlist; and determine, by the data processing system, a temperature rise in the plurality of wires based on the thermal network and the computed root mean square current, wherein generating the thermal network comprises:

mapping a given resistor in the resistor and capacitor netlist, representing a wire or contact in the physical design, to a thermal resistor; and determining a thermal resistance, $R_T$, of the thermal resistor as follows:

$$R_T = \frac{R_E}{\rho \times k},$$

where $\rho$ is a metal resistivity, k is a thermal conductivity of the wire or contact, and $R_E$ is an electrical resistance of the wire or contact.

16. The apparatus of claim 15, wherein generating the thermal network comprises:

converting electrical capacitances to thermal resistances; and converting electrical resistances to thermal resistances.

17. The apparatus of claim 15, wherein generating the thermal network comprises:

representing heat in wires by current sources in the thermal network.

18. The apparatus of claim 15, wherein the computer readable program further causes the computing device to:

compare the temperature rise in the plurality of wires to a threshold; and responsive to the temperature rise being greater than the threshold, modify the physical design.

19. The apparatus of claim 15, wherein the instructions further cause the processor to obtain the resistor and capacitor netlist from resistance/capacitance extraction performed for circuit timing analysis.

* * * * *